United States Patent
Kuo et al.

(10) Patent No.: US 8,984,354 B2
(45) Date of Patent: Mar. 17, 2015

(54) TEST SYSTEM WHICH SHARES A REGISTER IN DIFFERENT MODES

(75) Inventors: Shuo-Fen Kuo, Hsinchu County (TW); Jih-Nung Lee, Hsinchu County (TW); Sung-Kuang Wu, New Taipei (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 306 days.

(21) Appl. No.: 13/476,026

(22) Filed: May 21, 2012

(65) Prior Publication Data

US 2012/0304032 A1     Nov. 29, 2012

(30) Foreign Application Priority Data

May 27, 2011   (TW) .............................. 100118611 A

(51) Int. Cl.
| | |
|---|---|
| G01R 31/28 | (2006.01) |
| G11C 29/12 | (2006.01) |
| H03M 13/15 | (2006.01) |
| G11C 11/41 | (2006.01) |
| G11C 29/04 | (2006.01) |

(52) U.S. Cl.
CPC ....... G11C 29/1201 (2013.01); H03M 13/1545 (2013.01); G11C 29/12 (2013.01); *G11C 11/41* (2013.01); *G11C 2029/0405* (2013.01)
USPC ............ 714/726; 714/718; 714/729; 714/733

(58) Field of Classification Search
CPC ........... G11C 11/41; G11C 2029/0405; G11C 29/1201; G11C 29/12; H03M 15/45
USPC .................. 714/718, 726, 729, 733
See application file for complete search history.

(56) References Cited

U.S. PATENT DOCUMENTS

| | | | | |
|---|---|---|---|---|
| 6,088,823 | A  * | 7/2000 | Ayres et al. .................... | 714/733 |
| 6,973,631 | B2 | 12/2005 | Huang | |
| 7,103,814 | B2 * | 9/2006 | Corbin et al. ................. | 714/726 |
| 7,152,194 | B2 * | 12/2006 | Vinke et al. .................... | 714/726 |
| 7,254,762 | B2 * | 8/2007 | Anzou et al. ................... | 714/733 |
| 7,340,658 | B2 * | 3/2008 | Seuring ......................... | 714/726 |
| 2005/0204232 | A1 | 9/2005 | Seuring | |
| 2010/0037109 | A1 * | 2/2010 | Nadeau-Dostie et al. .... | 714/719 |
| 2013/0080847 | A1 * | 3/2013 | Zorian et al. ................. | 714/718 |

OTHER PUBLICATIONS

Narayanan, S.; Breuer, M.A., "Reconfiguration techniques for a single scan chain," Computer-Aided Design of Integrated Circuits and Systems, IEEE Transactions on , vol. 14, No. 6, pp. 750,765, Jun. 1995.*
Chang, S.-C.; Lee, K.J.; Wu, Z.-Z.; Jone, W.-B., "Reducing test application time by scan flip-flops sharing," Computers and Digital Techniques, IEE Proceedings—, vol. 147, No. 1, pp. 42,48, Jan. 2000.*
Jiann-Chyi Rau; Po-Han Wu; Chia-Jung Liu, "A Novel Hardware Architecture for Low Power and Rapid Testing of VLSI Circuits," Circuits and Systems, 2006. APCCAS 2006. IEEE Asia Pacific Conference on , vol., No., pp. 1883,1886, Dec. 4-7, 2006.*
Fakhrieh, F.; Shamshiri, S.; Pedram, A.; Sobhani, A.; Navabi, Z., "Scan Chain Bypass by Use of Skip Path," Microelectronics, 2005. ICM 2005. The 17th International Conference on , vol., No., pp. 82,85, Dec. 13-15, 2005.*

* cited by examiner

Primary Examiner — Cynthia Britt
(74) Attorney, Agent, or Firm — Winston Hsu; Scott Margo

(57) ABSTRACT

A test system, comprising: a BIST circuit for generating a first signal; a storage apparatus, for storing the first signal to generate a second signal; a first logic circuit, for generating a third signal; a second logic circuit; a register; and a passby circuit. In a first mode, the BIST circuit transmits the first signal to the storage device, the storage device outputs the second signal to the register for registering, and then the register outputs the registered second signal to the BIST circuit to test the storage apparatus. In a second mode, the first logic circuit transmits a third signal to the register for registering, and then the register outputs the registered third signal to the second logic circuit.

14 Claims, 3 Drawing Sheets

TEST SYSTEM WHICH SHARES A REGISTER IN DIFFERENT MODES

BACKGROUND OF THE INVENTION

1. Field of the Invention

The present invention relates to a testing system, and particularly relates to a testing system sharing a register.

2. Description of the Prior Art

Conventionally, a BIST (Built-In Self Test) circuit is utilized to test an eSRAM (embedded SRAM). The data is output from the BIST circuit, stored to a SRAM to be test and then output, such that the SRAM can be determined if it has error or not. For the synchronization of the timing for the BIST circuit and the SRAM, a pipeline register will be provided at an output terminal of the SRAM, which will only be active while testing SRAM.

Besides the above-mentioned SRAM test, circuit function test will also be performed to the circuit (i.e. scan test). That is, a signal is transmitted from a logic circuit to another logic circuit, to test if any problem for the function of the signal transmitting path and the SRAM exists. In such case, a passby circuit is provided to isolate the SRAM and the logic circuit to increase test coverage of the logic circuit. Such passby circuit includes a register and another logic unit (ex. an XOR gate), and is only activated when the circuit function test is performed. Accordingly, the extra-provided passby circuit register and the pipeline register will increase a large amount of circuit areas.

Additionally, many inventions are provided to isolate the SRAM and the passby circuit. For example, U.S. Pat. No. 6,973,631 utilizes different passby circuits to isolate the SRAM and the passby circuit. However, such structure increases the area of the passby circuit. Also, a register is necessarily provided to the peripheral region of the SRAM to increase test coverage of the SRAM, thus the issue for large circuit area worsens. In view of above-mentioned description, prior art has the issue of large circuit area, in order to isolate the SRAM and the logic circuit.

SUMMARY OF THE INVENTION

One objective of the present invention is to provide a testing system that can save circuit area.

One embodiment of the present application discloses a testing system, which comprises: a BIST circuit, for generating a first signal; a storage apparatus, coupled to the BIST circuit, for storing the first signal to form a second signal; a first logic circuit, coupled to the storage apparatus, for generating a third signal; a second logic circuit, coupled to the storage apparatus; a register, coupled to the storage apparatus and the second logic circuit; and a passby circuit, coupled to the BIST circuit, the first logic circuit and the register. In a first mode, the BIST circuit transmits the first signal to the storage apparatus, the storage apparatus outputs the second signal to the register for registering, then the register transmits the registered second signal to the BIST circuit to test the storage apparatus. Also, in a second mode, the first logic circuit transmits a third signal to the register for registering, the register transmits the registered third signal to the second logic circuit, to test a transmitting path between the first logic circuit and the second logic circuit, or to test at least one of the first logic circuit and the second logic circuit.

Another embodiment of the present application discloses a testing system, which comprises: a BIST circuit, for generating a first signal; a storage apparatus, coupled to the BIST circuit, for storing the first signal to form a second signal; a second logic circuit, coupled to the storage apparatus; a register, coupled to the storage apparatus and the second logic circuit; and passby circuit, coupled to the BIST circuit and the register. In a first mode, the BIST circuit transmits the first signal to the storage apparatus, the storage apparatus outputs the second signal to the register for registering, then the register transmits the registered second signal to the BIST circuit to test the storage apparatus. In a second mode, the BIST circuit transmits a fourth signal to the register for registering, via the passby circuit, the register transmits the registered fourth signal to the second logic circuit, to test a signal transmitting path between the BIST circuit and the second logic circuit, or to test at least of the BIST circuit and the second logic circuit.

Still another embodiment of the present application discloses a testing system, which comprises: a first path, for testing a storage apparatus; a second path, for testing a signal transmitting path between a first logic circuit and a second logic circuit, or for testing at least one of the first logic circuit and the second logic circuit; and a register, the first path and the second path sharing the register to respectively register signals for testing.

Via above-mentioned embodiments, the concept disclosed by the present invention can share the same register in two test modes, thereby the circuit area can be decreased. Additionally, the switch circuit including the register can be varied corresponding to different cost and design requirement.

These and other objectives of the present invention will no doubt become obvious to those of ordinary skill in the art after reading the following detailed description of the preferred embodiment that is illustrated in the various figures and drawings.

DETAILED DESCRIPTION

The concept, characteristics and function of the present application can be clearly understood according to following embodiments and figures.

Figure 1:
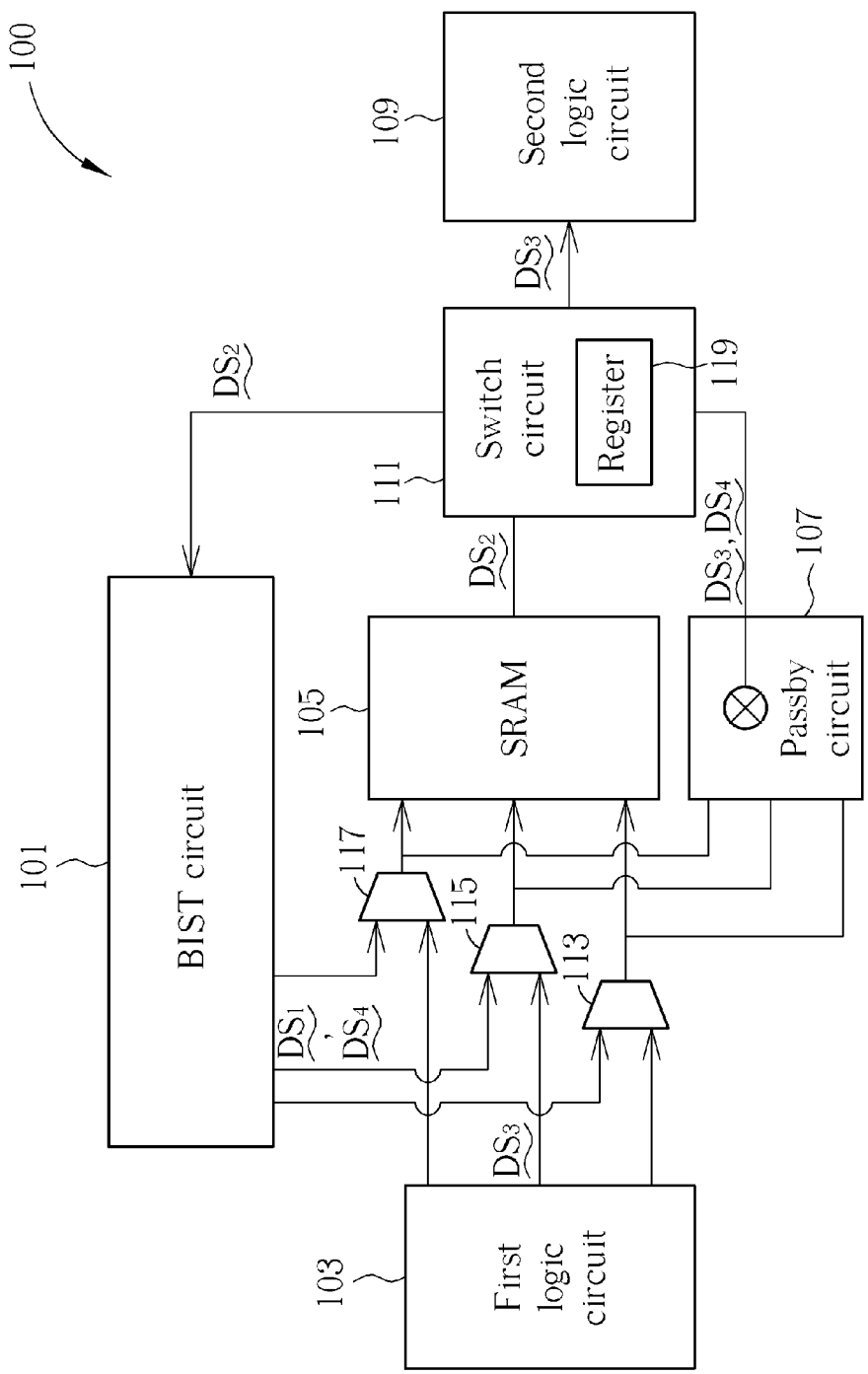
FIG. 1 illustrates a testing system according to an embodiment of the present application.

FIG. 1 illustrates a testing system according to an embodiment of the present application. As shown in FIG. 1, the testing system 100 includes a BIST circuit 101, a first logic circuit 103, an SRAM (also can be other types of storage apparatuses) 105, a passby circuit 107, a second logic circuit 109 and a switch circuit 111. A plurality of multiplexers 113, 115 and 117 can be provided between the first logic circuit 103 and the SRAM 105 to determine the signal transmitting path. It should be noted that the multiplexers 113, 115 and 117 are respectively utilized to transmit data, control signals and addresses, but do not mean that the testing system of the present application necessarily include three or more multiplexers.

In this embodiment, the BIST circuit 101 transmits a first signal $DS_1$ to the SRAM 105 in a BIST mode. Also, the SRAM 105 outputs a second signal $DS_2$ that is formed by storing the first signal $DS_1$, to the register 119 for registering. After that, the register 119 transmits the registered second signal to the BIST circuit 101 to test the SRAM 105.

In the scan test mode, the first logic circuit 103 transmits a third signal $DS_3$ to the register 119 for registering via the passby circuit 107. The register 119 transmits the registered third signal $DS_3$ to the second logic circuit 109, to test a signal transmitting path between the first logic circuit 103 and the second logic circuit 109, or to test at least one of the first logic circuit 103 and the second logic circuit 109. Alternatively, in the scan test mode, the BIST circuit 101 transmits a fourth signal $DS_4$ to the register 119 for registering via the passby circuit 107. Then the register 119 transmits the registered fourth signal $DS_4$ to the second logic circuit 109, to test a signal transmitting path between the BIST circuit 101 and the second logic circuit 109, and/or to test at least one of the BIST circuit 101 and the second logic circuit 109. One example of the BIST mode test mentioned here is transmitting the signal to be test (the second signal $DS_2$) to the BIST circuit 101 and compared to the stored first signal $DS_1$, such that it can be acquired if the signal changes after stored to the SRAM and the SRAM can be determined to have issue or not. Such operation can be performed by the comparator (not illustrated) of the BIST circuit 101.

In this embodiment, a switch circuit 111 is provided for switching between two modes. The switch circuit 111 includes the register 119, and receives the second signal $DS_2$ and the third signal $DS_3$. The switch circuit 111 outputs the second signal $DS_2$ to the BIST circuit 101, and outputs the third signal $DS_3$ or the fourth signal $DS_4$ to the second logic circuit 109 in the scan test mode.

Figure 2:
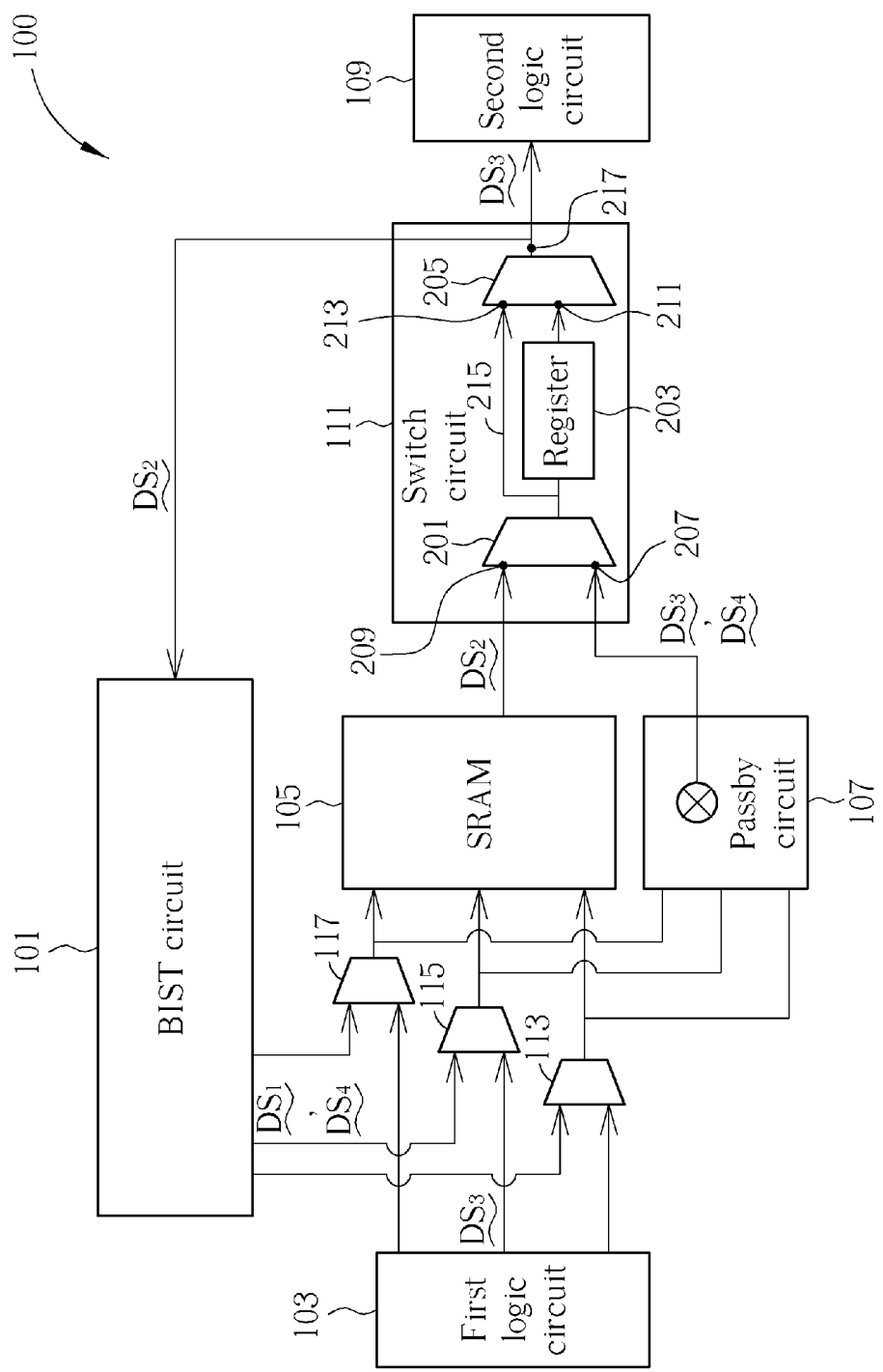
FIG. 2 and FIG. 3 illustrate detail structures of the testing system according to embodiments of the present application.
Figure 3:
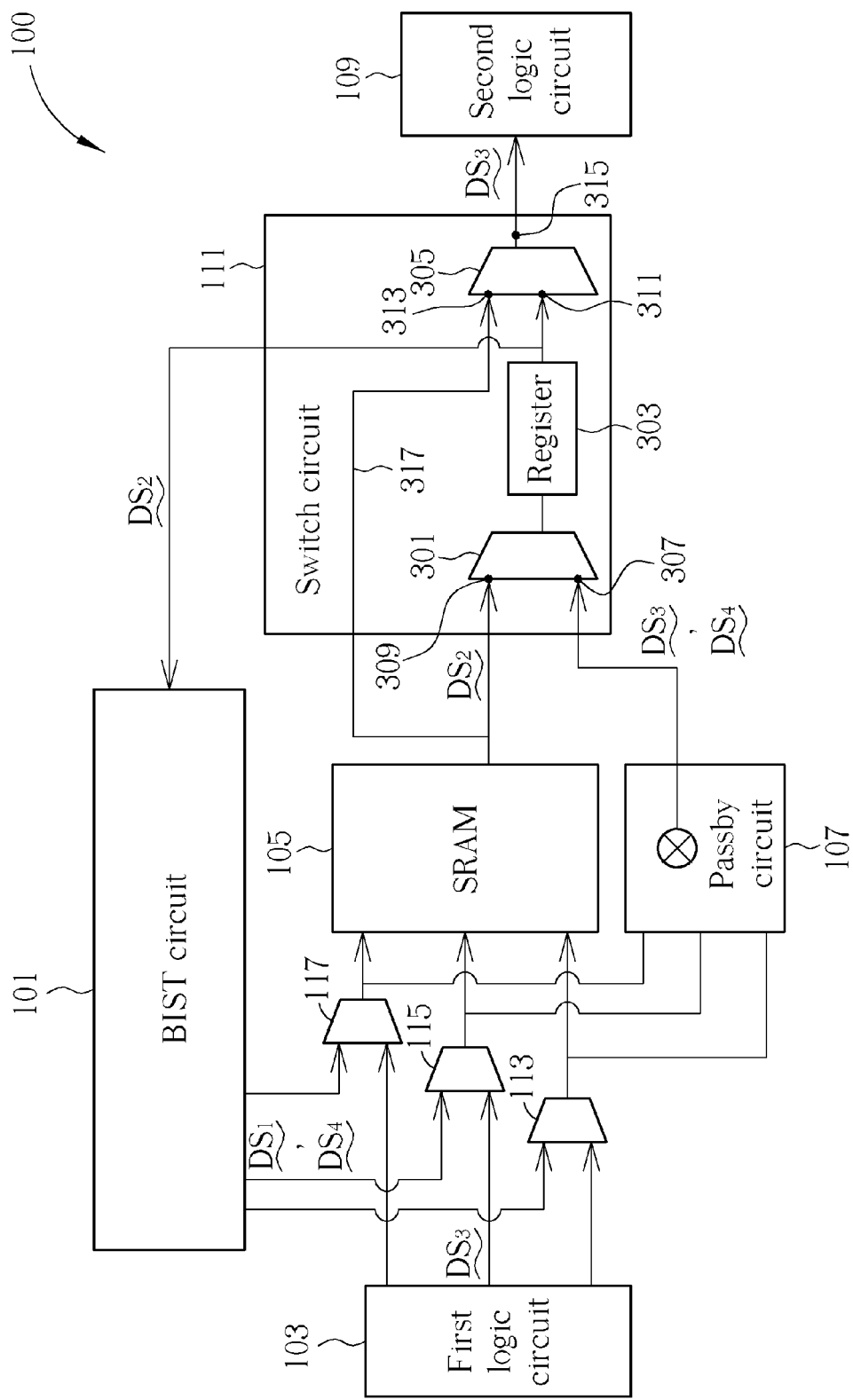

FIG. 2 and FIG. 3 illustrate detail structures of the testing system according to embodiments of the present application. In the embodiment of FIG. 2, the switch circuit 111 includes two multiplexers 201, 205 and a register 203 (i.e the register 119 in FIG. 1). The multiplexer 201 includes a first input terminal 207 coupled to an output of the passby circuit 107, and has a second input terminal 209 coupled to an output of the SRAM 105. The multiplexer 205 includes a first input terminal 211 coupled to the register 203, a second input terminal 213 coupled to the output of the multiplexer 201, and an output terminal 217 coupled to the BIST circuit 101 and the second circuit 109. In the BIST mode, the BIST circuit 101 transmits the first signal $DS_1$ to the SRAM 105, and the SRAM 105 outputs the second signal $DS_2$ to the second input terminal 209 of the multiplexer 201. The register 203 receives the second signal $DS_2$ from the multiplexer 201 and transmits the registered second signal $DS_2$ to the first input terminal 211 of the multiplexer 205. The multiplexer 205 transmits the second signal $DS_2$ to the BIST circuit 101.

In the scan mode, the first logic circuit 103 transmits the third signal $DS_3$ to the passby circuit 107, or the BIST circuit 101 transmits the fourth signal $DS_4$ to the passby circuit 107. The passby circuit 107 transmits the third signal $DS_3$ to the first input terminal 207 of the multiplexer 201. The register 203 receives the third signal $DS_3$ or the fourth signal $DS_4$ from the multiplexer 201, and transmits the registered third signal $DS_3$ or the fourth signal $DS_4$ to the first input terminal 211 of the second multiplexer 205. The multiplexer 205 transmits the third signal $DS_3$ or the fourth signal $DS_4$ to the second logic circuit 109.

In the embodiment shown in FIG. 2, the signal path 215, which is from the multiplexer 201 and passes by the register 203, to the multiplexer 205, is utilized in a normal state. That is, in the normal state, the signal is from the first logic circuit 103 and transmitted to the SRAM 105, then passes through the signal path 215 and then transmitted to the second logic circuit 109. Accordingly, the signal path 215 can be omitted from the embodiment shown in FIG. 2 without affecting above-mentioned function.

Furthermore, in the embodiment shown in FIG. 3, the switch circuit 111 includes a multiplexer 301, a register 303 and a multiplexer 305. The multiplexer 301 includes a first input terminal 307 coupled to an output of the passby circuit 107, and has a second input terminal 309 coupled to an output of the SRAM 105. The multiplexer 305 has a first input terminal 311 coupled to the register 303 and the BIST circuit 101, an output terminal 315 coupled to the second logic circuit 109, and a second input terminal 313 coupled to an output of the SRAM 105.

In the BIST mode, the BIST circuit 101 transmits a first signal $DS_1$ to the SRAM 105, which outputs the second signal $DS_2$ to the second input terminal 309 of the multiplexer 301. The register 303 receives the second signal $DS_2$ from the multiplexer 301 and transmits the registered second signal $DS_2$ to the BIST circuit 101.

In the scan mode, the first logic circuit 103 transmits the third signal $DS_3$ to the passby circuit 107, or the BIST circuit 101 transmits the fourth signal $DS_4$ to the passby circuit 107. The passby circuit 107 transmits the third signal $DS_3$ or the fourth signal $DS_4$ to the first input terminal 307 of the multiplexer 301. The register 303 receives the third signal $DS_3$ or the fourth signal $DS_4$ from the multiplexer 301 and transmits the registered the third signal $DS_3$ or the fourth signal $DS_4$ to the first input terminal 311 of the multiplexer 305. Also, the register 303 transmits the registered third signal $DS_3$ or the fourth signal $DS_4$ to the second logic circuit 109.

In the embodiment shown in FIG. 3, the signal path 317, which is from the second input terminal 309 of the multiplexer 301 and passes by the register 303 to the multiplexer 305, is utilized in the normal state. That is, in the normal state, the signal is from the first logic circuit 103 and transmitted to the SRAM 105, then passes through the signal path 317 and transmitted to the second logic circuit 109. Accordingly, the signal path 317 can be omitted from the embodiment shown in FIG. 3 without affecting above-mentioned function.

Via above-mentioned embodiments, the concept disclosed by the present invention can share the same register in two test modes, thereby the circuit area can be decreased. Additionally, the switch circuit including the register can be varied corresponding to different cost and design requirement.

Those skilled in the art will readily observe that numerous modifications and alterations of the device and method may be made while retaining the teachings of the invention.

What is claimed is:

1. A testing system, comprising:
   a BIST circuit, arranged to output a first signal;
   a storage apparatus, coupled to the BIST circuit, arranged to store the first signal, and arranged to output the stored first signal as a second signal;
   a first logic circuit, coupled to the storage apparatus, arranged to output a third signal;
   a second logic circuit, coupled to the storage apparatus;
   a register, coupled to the storage apparatus and the second logic circuit; and
   a passby circuit, coupled to the BIST circuit, the first logic circuit and the register; wherein,
   in a first mode, the BIST circuit transmits the first signal to the storage apparatus, the storage apparatus outputs the second signal to the register thereby the second signal is registered by the register, then the register transmits the registered second signal to the BIST circuit to test the storage apparatus;
   in a second mode, the first logic circuit transmits a third signal to the register thereby the third signal is registered by the register, the register transmits the registered third signal to the second logic circuit, to test a signal transmitting path between the first logic circuit and the second logic circuit, and to test at least one of the first logic circuit and the second logic circuit.

2. The testing system of claim 1, wherein the testing circuit includes a comparator, the comparator compares the first signal and the registered second signal, to test the storage apparatus according to a comparing result between the first signal and the registered second signal.

3. The testing system of claim 1, further comprising:
a switch circuit, comprising the register, arranged to receive the second signal and the third signal, arranged to output the registered second signal to the BIST circuit in the first mode, and arranged to output the registered third signal to the second logic circuit in the second mode.

4. The testing system of claim 3, wherein the switch circuit includes:
a first multiplexer, including a first input terminal coupled to an output of the passby circuit, and a second input terminal coupled to an output of the storage apparatus;
the register; and
a second multiplexer, including:
a first input terminal coupled to the register; and
an output terminal coupled to the BIST circuit and the second logic circuit.

5. The testing system of claim 4, wherein the second multiplexer further includes:
a second input terminal coupled to an output of the first multiplexer.

6. The testing system of claim 4, wherein in the first mode, the BIST circuit transmits the first signal to the storage apparatus, the storage apparatus outputs the second signal to the second input terminal of the first multiplexer, the register receives the second signal from the first multiplexer and transmits the registered second signal to the first input terminal of the second multiplexer, and the second multiplexer transmits the second signal to the BIST circuit.

7. The testing system of claim 4, wherein in the second mode, the first logic circuit transmits the third signal to the passby circuit, the passby circuit transmits the third signal to the first input terminal of the first multiplexer, the register receives the third signal from the first multiplexer and transmits the registered third signal to the first input terminal of the second multiplexer, and the second multiplexer transmits the registered third signal to the second logic circuit.

8. The testing system of claim 3, wherein the switch circuit comprises:
a first multiplexer, includes a first input terminal coupled to an output of the passby circuit, and a second input terminal coupled to an output of the storage apparatus;
the register; and
a second multiplexer, includes:
a first input terminal coupled to the register and the BIST circuit; and
an output terminal coupled to the second logic circuit.

9. The testing system of claim 8, wherein the second multiplexer further includes:
a second input terminal, coupled to an output of the storage apparatus.

10. The testing system of claim 8, wherein in the first mode, the BIST circuit transmits the first signal to the storage apparatus, the storage apparatus outputs the second signal to the second input terminal of the first multiplexer, and the register receives the second signal from the first multiplexer and transmits the registered second signal to the BIST circuit.

11. The testing system of claim 8, wherein in the second mode, the first logic circuit transmits the third signal to the passby circuit, the passby circuit transmits the third signal to the first input terminal of the first multiplexer, the register receives the third signal from the first multiplexer and transmits the registered third signal to the first input terminal of the second multiplexer, and the register transmits the registered third signal to the second logic circuit.

12. The testing system of claim 1, wherein in the second mode, the BIST circuit transmits a fourth signal to the register via the passby circuit, thereby the fourth signal is registered by the register, wherein the register transmits the registered fourth signal to the second logic circuit, to test the signal transmitting path between the BIST circuit and the second logic circuit, and to test the at least one of the BIST circuit and the second logic circuit.

13. A testing system, comprising:
a BIST circuit, arranged to output a first signal;
a storage apparatus, coupled to the BIST circuit, arranged to store the first signal, and arranged to output the stored first signal as a second signal;
a second logic circuit, coupled to the storage apparatus;
a register, coupled to the storage apparatus and the second logic circuit; and
a passby circuit, coupled to the BIST circuit and the register; wherein,
in a first mode, the BIST circuit transmits the first signal to the storage apparatus, the storage apparatus outputs the second signal to the register, thereby the second signal is registered by the register, then the register transmits the registered second signal to the BIST circuit to test the storage apparatus;
in a second mode, the BIST circuit transmits a fourth signal to the register via the passby circuit, thereby the fourth signal is registered by the register, the register transmits the registered fourth signal to the second logic circuit, to test a signal transmitting path between the BIST circuit and the second logic circuit, or to test at least one of the BIST circuit and the second logic circuit.

14. The testing system of claim 13, further comprising:
a switch circuit, comprising the register, arranged to receive the second signal and the third signal, arranged to output the registered second signal to the BIST circuit in the first mode, and arranged to output the registered third signal to the second logic circuit in the second mode.

* * * * *